United States Patent [19]

Sharber et al.

[11] Patent Number: 5,270,912

[45] Date of Patent: * Dec. 14, 1993

[54] ELECTROFISHING APPARATUS AND METHOD

[75] Inventors: Norman G. Sharber; John P. Sharber, both of Flagstaff, Ariz.

[73] Assignee: Coffelt Manufacturing, Inc., Flagstaff, Ariz.

[*] Notice: The portion of the term of this patent subsequent to May 5, 2009 has been disclaimed.

[21] Appl. No.: 876,180

[22] Filed: Apr. 30, 1992

Related U.S. Application Data

[63] Continuation of Ser. No. 446,652, Dec. 6, 1989, Pat. No. 5,111,379.

[51] Int. Cl.$^5$ .................... H02M 7/155; A01K 79/00
[52] U.S. Cl. .................... 363/128; 307/106; 43/171
[58] Field of Search .................... 363/84, 85, 87, 88, 363/128, 129; 307/106, 107, 108; 43/17.1

[56] References Cited

U.S. PATENT DOCUMENTS 4,825,810 5/1989 Sharber.

OTHER PUBLICATIONS 2-page product description: Model GFBB-1.5-U and Model GFFG-0.5-D by Smith-Root.
"Electrofishing-Induced Spinal Injury in Rainbow Trout"; Sharber, Carothers, Sharber; Ichthyo Technologies, Flagstaff, Arizona (1989).
"Influence of Electrofishing Pulse Shape on Spinal Injuries in Adult Rainbow Trout"; Sharber and Carothers; Ichthyo Technologies, Flagstaff, Ariz. (1988).
*North American Journal of Fisheries Management*, vol. 8, pp. 516-518, Reynolds & Kolz (1988).
"Submerged, Electrically Shielded Live Tank for Electrofishing Boats", Sharber & Carothers, *North American Journal of Fisheries Management*, vol. 7 pp. 450-453 (1987).
"Electrofishing, A Power Related Phenomenon"; Kolz & Reynolds; Fish and Wildlife Technical Report No. 22, US Dept. of Interior Fish and Wildlife Service.
*Anchorage Daily News*, May 29, 1988, "State Zaps Spring Plans for Tagging Kenai Rainbows".
Selected pages from "Fishing With Electricity", European Inland Fisheries Advisory Commission, pub by Food and Agriculture Organization of the United Nations.

Primary Examiner—Emanuel T. Voeltz
Attorney, Agent, or Firm—Cahill, Sutton & Thomas

[57] ABSTRACT

To minimize injury during electrofishing while inducing a high degree of electrotaxis, a packet of DC pulses having sharp leading edges and preferably an exponential or square decay are transmitted under water between an anode electrode and a cathode electrode several times each second to stimulate contraction of the red muscle tissues and bring about electrotaxis without inducing epileptic seizure of the white muscle tissues of fish and thereby avoiding injury to the fish.

19 Claims, 3 Drawing Sheets

CPS CIRCUIT, PARTS LIST

| | |
|---|---|
| U1, U3, U4 | — MC1455 |
| U2 | — MC14013 |
| U5 | — MC14017 |
| U6 | — UA741 |
| VR1, VR2 | — LM340-12 |
| TR1 | — 2N5446 |
| SCR1 | — C149M20 |
| SCR2 | — 2N698 |
| T1 | — 2N3904 |
| T2 | — MJE700 |
| T3 | — 2N5190 |
| L1 | — WX-173, 6MH |
| BR1 | — KBPC-35-06 |
| BR2, BR3 | — IN4007 |
| D1 | — ST-2 |
| D2 | — IN4007 |
| C1, C2 | — 3000uf, 350V |
| C3 | — .15uf, 600V |
| C4, C5 | — 1000uf, 50V |
| C6, C8, C11, C13, C14 | — .22uf, 25V |
| C7, C9, C10, C12 | — .01uf, 25V |
| C15 | — .2uf, 400V |
| R1 | — 2.2K, 1/2W |
| R2 | — 750, 200W |
| R3 | — 3K, 1/4W |
| R4, R5, R6, R16 | — 1K, 1/4W |
| R7-11 | — 10K, 1/4W |
| R12-15 | — 330, 1/2W |
| R17 | — 150, 1/2W |
| P1 | — 500K, 2W |
| P2 | — 500K |
| P3, P4 | — 50K | fig. 3

ELECTROFISHING APPARATUS AND METHOD

This is a continuation of application Ser. No. 446,652, filed Dec. 6, 1989, now U.S. Pat. No. 5,111,379.

BACKGROUND OF THE INVENTION

1. Field of the Invention

The present invention relates to electrofishing and, more particularly, to apparatus and method for minimizing the likelihood of injury to fish while inducing electrotaxis and narcosis.

2. Description of the Prior Art

Electric fishing has been known since at least 1863 when a British patent directed to the subject was granted. However, it was not until after World War I that serious attention began to be given to electric fishing or electrofishing. As a result of various studies and investigations, certain conclusions reached by various researchers have been taken to be truisms. Some of these conclusions are based upon inadequate data, unsubstantiated assumptions or insufficient inspection and analysis of the fish caught and are therefore suspect.

There are many uses for electrofishing which are carried out to the extent the equipment available permits and without inducing an unacceptable mortality rate. Electrofishing permits the capture and removal of fish population from one locality to another. It permits surveys or population estimates to determine the type and number of fish present and their size range. Such estimates may also uncover natural fluctuations in population and assess the impact of channelization. Electrofishing permits guiding the movement of fish such as keeping predators away from freshly planted fry, keeping fish away from electric power plant water intakes, keeping migrating fish away from specific areas en route and trapping fish (such as the sea lampreys in the Great Lakes). Biological sampling may be accomplished through electrofishing to collect brood stock, determine species composition, tabulate size and age characteristics. Food habits can be determined by collecting fish at feeding areas. Tagging and marking studies are readily carried out by acquiring fish by electrofishing, provided that the stresses of handling and shocking do not injure or kill too large a percentage. The prospect of injury and death is of particular concern when one is dealing with endangered species of fish.

Electrofishing permits a determination of seasonal migrations. Fish can be readily counted by recording changes in underwater field strength due to passage of fish therepast. Electrofishing can be used as an anaesthetic to assist in treating sick fish, such as parasite control, and to quiet fish for handling. Electrofishing can be used for collecting floating invertebrates and electrofishing can be used to quickly and efficiently electrocute fish without degrading the commercial value of the catch since the fish scales remain intact.

During electrofishing with pulsed DC electric current, a fish will have several reactions, depending upon the field strength or density in which it finds itself and upon the frequency, shape and width of the pulses. The first reaction is that of frightening the fish. A second reaction is electrotaxis, the involuntary exercise of swimming muscles to draw the fish toward the source of electric current. The third reaction is narcosis when the muscles go limp and the fish rolls on its side; this permits netting and acquisition of the fish. The fourth reaction is tetanus which is an involuntary contraction of the muscles without interleaved relaxation and can result in death. A fifth reaction can occur if the white muscles of the fish are stimulated to the point of an epileptic seizure, thereby causing morphological trauma.

Since the inception of electrofishing for scientific purposes, there have been reports of injuries to fish due to exposure to electric stimuli. The injuries include compression of the spinal column, torn supportive tissues around various organs and broken blood vessels (hematomas). In general, these injuries have been thought to be the result of high current densities which may be encountered by the fish near an electrode.

In normal electrofishing practice, direct current or pulsed direct current is used because aquatic animals will move, in general, to the anode electrode. In the case of fish, this movement, electrotaxis, involves a pseudo swimming reaction. As a fish approaches the anode electrode, it encounters an exponentially increasing field strength. At some critical value of field strength, depending upon many physical factors, such as the water conductivity, the fish may cease electrotaxis action, enter a state of narcosis and then tetanus, a few feet from the anode electrode or very near it. Often, the critical state occurs a few feet from the anode electrode or very near it. In either case, the fish almost always drifts near to or may actually touch the anode electrode. The field strength within this zone causing tetanus is very high and a significant flow of electric current through the fish occurs. This electric current is generally believed to stimulate and then overwhelm the neuromuscular system of the fish. It is believed that the overwhelmed neuromuscular system causes the above referenced trauma.

This view overlooks or disregards facts relating to muscle cells and proven in laboratory experiments by biology researchers. A neuromuscular response requires a minimum threshold level of external electrical stimulus before response. Once the existence of a response is established, the following principal factors determine the type of response: frequency of pulse, duration (or width) of each pulse and the shape of each pulse.

It is known and accepted that a nerve cell responds best to an almost instantaneous rise from zero to a maximum value in less than 1 ms. When a cell responds or "fires", contraction is initiated, which contraction will proceed without regard to further external stimulus. If the external stimulus is brief, the cell will relax in approximately 1/300 of a second and be ready for the next pulse stimulus. In the event the initiating pulse has a long on time, the cell becomes stressed due to lack of relaxation and it may remain contracted. Tetanus is the constant unrelieved contraction of a muscle cell.

Preferably, the leading edge of the pulse is sharp enough to fully stimulate the nerve cell. Should the leading edge represent a sloping gradual rise to the firing point of the cell, traumatization and tetanus will result. The trailing edge of the pulse can be either square or exponential in decay time. Should the slope of the pulse be sinusoidal or a linear decay, the cell might not relax and such lack of relaxation will lead to trauma and tetany.

In a paper entitled "Influence of Electrofishing Pulse Shape on Spinal Injuries in Adult Rainbow Trout" (1988), Sharber and Carothers evaluated the effect of three wave forms of pulsed DC on spinal injury to 300 to 560 mm rainbow trout captured by electrofishing. The overall injury incidence was 50% with a significantly higher incidence (67%) in fish stunned with a quarter sine wave than those captured with either exponential or square waves (44% each). Smaller fish or fish in less conductive water appear to have a lower incidence of injury, as reported in other studies. In a recent study by the Alaska Department of Fish and Game, the incidence of spinal injury to rainbow trout having a fork length of greater than 400 mm was 50%. As the result of such high incidence, further electrofishing for population studies of large rainbow trout has been suspended in Alaska until an acceptable solution is found. The pulse rate employed was 60 pulses/second.

Based upon criticism from authorities in the field of electrofishing, it was suggested that a pulse frequency of 500 pulses/second having a width of 0.2 ms. would prevent the injuries caused by a pulse rate of 60 pulses/second. The basis for this argument resided in a contention that the muscle cells would not respond to the repetitive pulsation with their limited 300 contraction cycles per second and, without response, would not be traumatized to the extent that injuries occur. Based upon a further study performed and reported in a paper entitled "Electrofishing Induced Spinal Injury in Rainbow Trout" (Sharber, Carothers, Sharber), various experiments were performed changing the pulse frequency through a range of 15 to 512 pulses/second and a correlation between injury rate and frequency was established. Based upon this study, less than 3% of the trout were injured at a frequency of 15 pulses/second with the incidence of injury rising to 24% at 30 pulses/second. From 60 to 512 pulses/second, the injury rate occurrence was 42% to 61%, respectively. Accordingly, the experimental results did not support an authoritarian viewpoint.

Further authorities in the field have postulated that the intensity of the field attendant a relatively small electrode results in overwhelming electric currents in the fish and thereby traumatize the muscles of the fish leading to broken backs. As discussed in further detail in the above identified paper entitled "Influence Of Electrofishing Pulse Shape On Spinal Injuries In Adult Rainbow Trout", experimental results indicate that electrode size and shape, even though producing substantially different current gradients, had little or no influence on the rate of spinal injury.

SUMMARY OF THE INVENTION

A packet of DC pulses having sharp leading edges and, preferably, exponential or square decays are transmitted under water between electrodes to stimulate contraction of the red muscle tissues without substantially affecting the white muscle tissues of the fish. The number of individual pulses and their pulse width may be varied. Similarly, the number of pulse packets per second may be varied in an effective range of approximately 5 to 25 packets per second. These variables permit optimizing the performance of equipment for different species of fish and various physical features attendant the habitat being electrofished and relating to water conductivity, temperature, depth and size of fish even within a species. A high frequency oscillator generates the high frequency pulses which are counted by a counter to limit the number of pulses per packet. A low frequency oscillator controls the number of packets of pulses per second transmitted and means are provided to permit variation in the pulse width. The output is a burst of high frequency pulses having square wave leading edges repeated at a low frequency high voltage direct current.

It is therefore a primary object of the present invention to provide apparatus for managing the injury to fish to an acceptable level during electrofishing.

Another object of the present invention is to provide apparatus for inducing electrotaxis with a low injury rate.

Yet another object of the present invention is to provide apparatus for significantly stimulating only the red muscle groups during electrotaxis.

Yet another object of the present invention is to provide apparatus for generating a burst of high frequency pulses repeated at a low frequency high voltage direct current.

A further object of the present invention is to provide a method for inducing electrotaxis and narcosis in fish with minimal injury.

A yet further object of the present invention is to provide a method for stimulating the red muscle tissues without inducing injury causing epileptic seizure in fish during electrofishing.

These and other objects of the present invention will become apparent to those skilled in the art as the description thereof proceeds.

BRIEF DESCRIPTION OF THE DRAWINGS

The present invention may be described with greater detail and specificity with reference to the following drawings, in which:

FIG. 3 is a table listing the circuit components and their respective values.

DESCRIPTION OF THE PREFERRED EMBODIMENT

Figure 1:
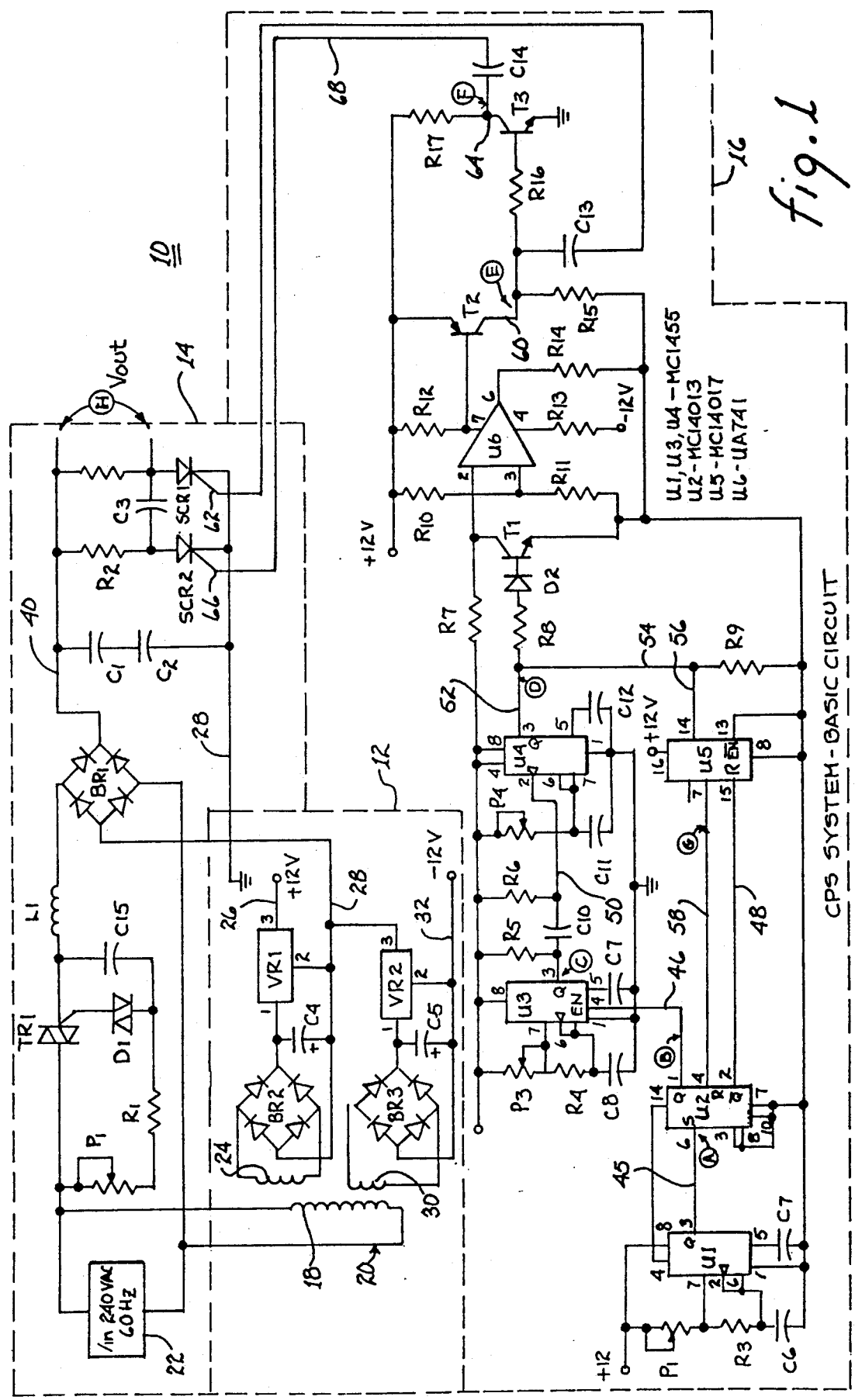
FIG. 1 illustrates a circuit for developing pulses to be used in electrofishing.

It is well known to biologists that fish have two groups of muscles. A first group, known as red muscles, are disposed along opposed sides of the body of the fish. These muscles are the swimming muscles. They are alternatively contracted to effect undulation and swimming motion by the fish. These muscles are relatively small sized but have great stamina and can be continuously active for long periods of time. The remaining muscles in a fish are referred to as white muscles. These muscles perform all the remaining body functions. They are generally large sized, very powerful and rapidly responding to a triggering impulse. Generally, they are pairs of muscles located on opposed sides of a fish. When paired groups of muscles are triggered, a contracting reaction occurs. Normally, cessation of the triggering impulse whether internally or externally induced, permits relaxation of the muscles. When the paired groups of muscles are overwhelmed by triggering impulses which preclude alternating relaxation, epileptic seizure occurs. Because of the substantial power of the white muscle groups, severe damage to the fish occurs during such seizure. The power of the muscles is sufficient to break or dislodge the spinal column; this injury is often fatal. A tearing of secondary muscles and tissues occurs which produce massive hematomas which are often fatal. Epileptic seizure of the white muscles can cause both short term and long term damage or injury to organs and may result in immediate or delayed death. Many of these injuries are not immediately visually apparent. Usually, X-ray films must be analyzed or autopsies must be performed to learn the extent of the injuries.

For years it has been thought that the red muscle tissues, which are responsible for the sustained swimming motion, were overwhelmed by electrical impulses due to a high field strength proximate an electrode during electrofishing. That is, it was believed that the degree of injury to fish was a function of the power level used during electrofishing and that the damage and injury was due to contractions of the red muscle groups. Based upon information supplied by biologists, it is generally accepted that the red muscle tissues are insufficiently powerful to break the spinal column or cause massive organ and tissue damage which has been found in fish injured by electrofishing. The white muscle tissues are, however, sufficiently powerful to cause the fatal or near fatal injuries. One must therefore conclude that the white muscle tissues are responsible for a significant part of the injuries caused during electrofishing.

Since field strength, for any given power input, is to some extent a function of the anode size, it was believed that modification of the electrode configuration would have a salutary effect in reducing the injury rate from approximately 50% to a very acceptable rate of less than 10%. Experiments indicate that a reduction in field strength due to a particular electrode configuration had little effect upon reducing the injury rate. The main difference appears to be that the distance at which electrotaxis resulted was substantially reduced.

As fish transition from electrotaxis to narcosis, the muscles relax and the fish essentially stop swimming. Depending upon the direction of the water current and other factors, migration of the fish toward the anode electrode may occur. Such migration will subject the fish to more intense or higher power level field strength. Tetanus may result with attendant severe or fatal injuries.

To prevent injury to fish during electrofishing, apparatus must be developed which affects the red muscle tissues to induce electrotaxis without simultaneously or subsequently causing contraction of the white muscle tissues. Based upon substantial experimentation and testing, a pulse train has been developed which includes high frequency pulses for stimulating the red muscle tissues and a sufficiently low repetition rate to permit the white muscle tissues to relax between contractions and thereby prevent epileptic seizure. A circuit for developing such a pulse train is illustrated in FIG. 1. Operation of this circuit has been effective at various power levels tested. At different power levels, only the distance at which electrotaxis is first induced varies; the injury rate does not seem to be a function of the power level. Moreover, different electrode configurations to modify the maximum field strength to which the fish may be subjected has had no significant effect upon the injury rate and has only affected the distance at which electrotaxis first occurs.

The pulse train transmitted by the circuit illustrated in FIG. 1 includes a plurality of packets, each packet having a plurality of high frequency pulses, which packets are repeated at a low frequency rate. The high frequency pulses will stimulate the red muscle tissues. The low repetition rate permits any contracted white muscle tissues to relax between contractions. With such relaxation, the white muscle tissues will not suffer epileptic seizure. Without epileptic seizure, significant damage to the fish will not occur.

Referring to FIG. 1, there is shown a circuit 10 for generating a plurality of packets of high frequency pulses repeated at a low frequency rate to produce a high voltage direct current for use in electrofishing. The circuit includes three sections. A power supply, designated by block 12, provides plus and minus 12 volts DC to the various circuit components. A high voltage DC section, designated by block 14, provides the output signal to a load $R_L$ representative of the anode electrode used in electrofishing. A timing/SCR drive section, designated by block 16, controls the shape and frequency of the pulse train present at the electrode anode ($R_L$).

Power supply 12 may be a conventional power supply wherein the primary coil 18 of transformer 20 is connected across an alternating current power supply 22. Secondary coil 24 provides power to a bridge rectifier BR2. The DC output of the bridge rectifier is smoothed by capacitor $C_4$ and regulated by voltage regulator $V_{R1}$. A +12 volt DC output is provided between conductor 26 and ground 28. A second bridge rectifier BR3 is connected across secondary coil 30 of transformer 20 to provide a DC output. The DC output is smoothed by capacitor $C_5$ and regulated by voltage regulator VR2. A −12 volt DC voltage is provided between conductor 32 and ground 28.

Referring to high voltage DC section 14, a full wave bridge rectifier BR1 is connected across power supply 22 to provide a high voltage direct current between conductor 40 and ground 28 and across series capacitors C1,C2. When silicon controlled rectifier SCR1 is turned on, power is applied across the load $R_L$. Silicon controlled rectifier SCR2 turns off SCR1 via commutating capacitor $C_3$. The voltage level at the anode electrode ($R_L$) is adjusted by a phase control circuit. That is, potentiometer $P_1$ is adjusted to fire diac $D_1$ at a selected point of the 60 cycle alternating current input. When diac $D_1$ fires, triac $TR_1$ is turned on. Choke $L_1$ provides di/dt protection for triac $TR_1$.

Figure 2:
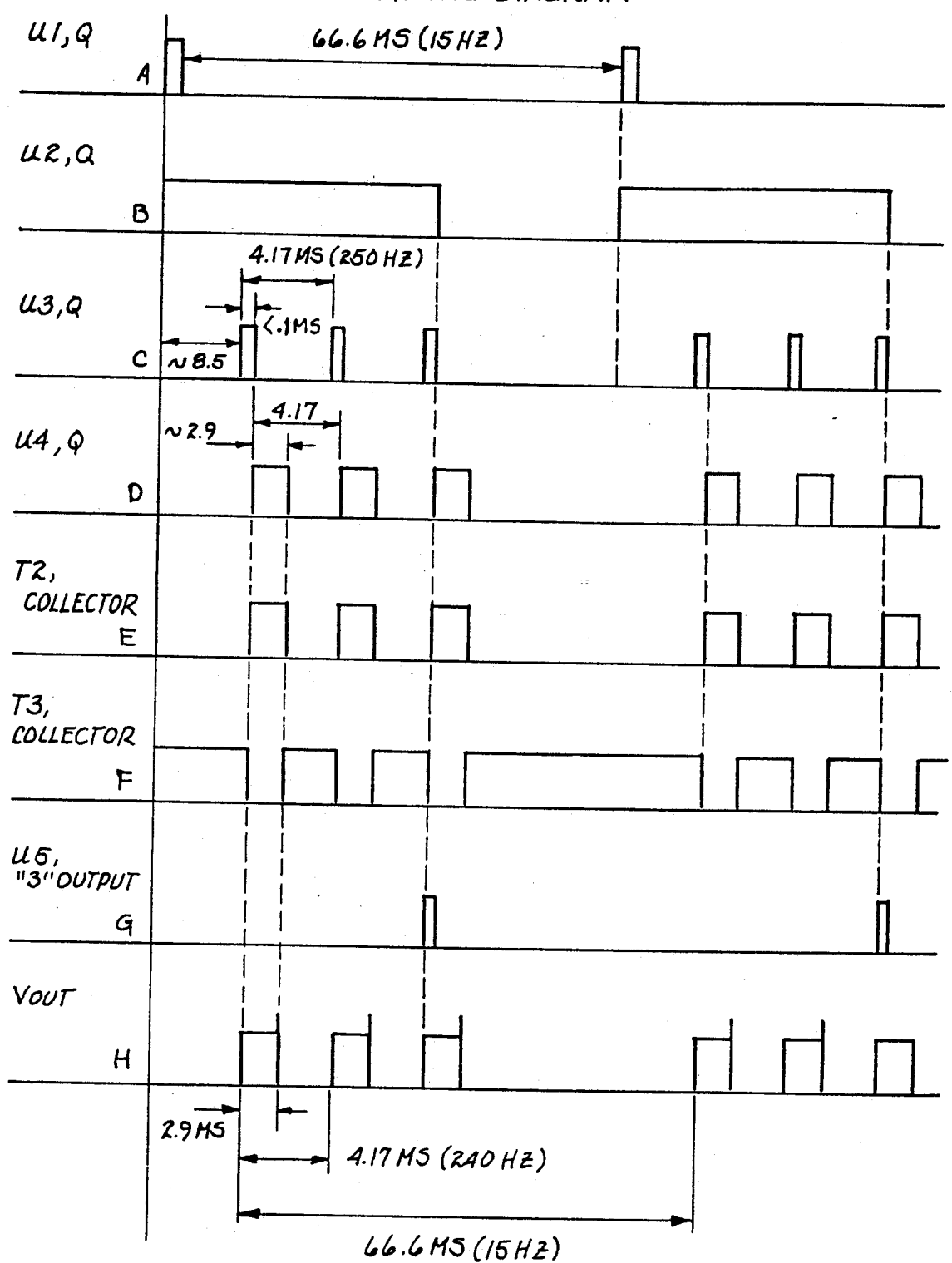
FIGS. 2A to 2H illustrate the wave forms at identified locations in the circuit shown in FIG. 1.

The timing cycle produced by timing/SCR drive section 16 begins with low frequency oscillator $U_1$. The frequency of this oscillator controls the repetition rate of the high frequency burst (packet of pulses). A high output at pin 3 of U1 is transmitted to pin 6 of flip flop U2 via conductor 45. The wave form of this pulse is illustrated in FIG. 2A. The output of flip flop U2 at pin 1 is an extended pulse, as represented in FIG. 2B. It enables, via conductor 46, high frequency oscillator U3. An output at pin 2 of flip flop U2 enables counter U5 via conductor 48. The frequency of oscillators U1 and U3 can be adjusted by potentiometer $P_1$ connected to pin 7 of oscillator U1 and by potentiometer $P_3$ connected to pin 7 of oscillator U3. The output of oscillator U3 on pin 3 is transmitted along conductor 50 to the trigger input at pin 2 of a one shot multi vibrator U4; the pulse train is depicted in FIG. 2C. The output pulse width of one shot multi vibrator U4 is controlled by potentiometer $P_4$ connected to pins 6 and 7. As shown in FIG. 2D, the pulse width of the pulse train at pin 3 of one shot multi vibrator U4 and conveyed on conductor 52 is, in example, approximately 2.9 milliseconds (ms). The repetition frequency of the pulses is approximately 4.17 ms (250 Hz), as is also indicated in FIG. 2C for the output of oscillator U3. The output of one shot multi vibrator U4 is conveyed to pin 14 of counter U5 via conductors 54,56. The leading edges of the pulses transmitted to the counter initiate the counting. In the example illustrated in FIGS. 2A to 2H, the number of pulses per packet has been set at 3. Accordingly, the output of counter U5 occurs on conductor 58 at each third count, as illustrated in FIG. 2G. The output pulse from counter U5 is transmitted via conductor 58 to pin 4 of flip flop U2. When pin 4 goes high, the flip flop is reset. The resetting disables the pulse train at output pin 1 and oscillator U3 is disabled. The commensurate output at pin 2 of flip flop U2 is transmitted via conductor 48 to pin 15 of counter U5 to reset/enable the counter. It may be noted that the number of pulses in each frequency burst is a function of the selected output pin of counter U5 to which conductor 58 is connected.

The output of one shot multi vibrator U4 is buffered through transistors T1,T2 and comparator U6. The rising edge of the square wave present at collector 60 of transistor T2 is coupled to gate 62 of silicon controlled rectifier SCR1 via capacitor C13. The wave form at collector 64 of transistor T2 is depicted in FIG. 2E. Transistor T3 inverts the wave form present at collector 60. The resulting pulses at collector 64 of transistor T3 are depicted in FIG. 2F. The rising edge of each pulse at collector 64 is applied to gate 66 of silicon controlled rectifier SCR2 via capacitor C14 and conductor 70. When silicon controlled rectifier SCR2 turns on, silicon controlled rectifier SCR1 is turned off. Similarly, when silicon controlled rectifier SCR1 is turned on, silicon controlled rectifier SCR2 is turned off. The resulting pulsed DC output across load $R_L$ is depicted in FIG. 2H.

As noted, the individual pulses may be approximately 2.9 ms in width with a repetition frequency of 240 Hz. The three pulses occur at the beginning of a 66.6 ms pulse train, which is equivalent to a low frequency of 15 packets per second (15 Hz). Each pulse of the three pulse packet depicted in FIG. 2H is a relatively high frequency pulse sufficient to trigger contraction of the red muscles in a fish. The relative low frequency pulse train repetition rate of 15 Hz has been well documented to be sufficiently low to permit relaxation of any contracted white muscles and epileptic seizure of such muscles is precluded.

The number of pulses per packet is believed to be variable in the range of 2 to 5 pulses per packet without resulting in any substantial injury to most fish. The pulse width may be varied at least within the range of 5 to 25 packets per second.

To summarize our understanding of the important features of our invention, the following conclusions are presented. Spinal compression injury and other internal traumas are the result of over stimulation (leading to an epileptic seizure) of paired white muscle systems in the fish. Low frequency pulses of DC current, e.g., 15 pps with a pulse width of 10 milliseconds, virtually eliminate the problem. However, low frequency does not stimulate good electrotaxis. Using high frequency pulses of narrow width in packets at approximately 15 packets per second retains the low injury rate and causes good electrotaxis response.

Based upon experience to date, the shape, frequency, width and the ratio of the high and low components of the pulse train are all sensed by the physiological systems of the target fish. More specially, the benefit of low injury and effective electrotaxis is dependent upon A) low "packet of pulses" frequency; B) shape, width, and number of high frequency pulses in each packet; and C) the ratio of the packet frequency to the number of the high frequency pulses per packet. If the number of packets per second is reduced (say from 20 to 10) then the number of high frequency pulses per packet needs to be increased (say from 3 to 4) in order to have the best overall results. If the number of high frequency pulses per packet is too great, fish will be narcotized too far from the anode electrode for easy capture. If the number is too low, the catch efficiency will decrease. If the number of packets is too high, the incidence of injuries will increase; if too low, the catch rate will be down. That is, there is an optimum ratio which our inventions allows the operator to choose to suit the type of fish and environment for a given electrofishing effort.

While the principles of the invention have now been made clear in an illustrative embodiment, there will be immediately obvious to those skilled in the art many modifications of structure, arrangement, proportions, elements, materials and components used in the practice of the invention which are particularly adapted for specific environments and operating requirements without departing from those principles.

We claim:

1. Electrofishing apparatus for inducing electrotaxis and narcosis with minimal injury to fish, said apparatus comprising in combination:
   a) a source of electrical power for operating said apparatus;
   b) means electrically connected to said power source for generating an output of high power pulses, said generating means including means for developing a pulse train having a packet of pulses repeated at a low frequency;
   c) means for modulating the power output of said generating means; and
   d) means for transmitting underwater the generated pulses.

2. The apparatus as set forth in claim 1 wherein said transmitting means includes an anode electrode and a cathode electrode separated sufficiently to allow an electric field created therebetween to spread outward through the water associated with the fish and their habitat.

3. The apparatus as set forth in claim 1 including means for establishing a repetition rate of packets of pulses per time to a predetermined number.

4. The apparatus as set forth in claim 1 including means for changing the pulse width of the pulses.

5. The apparatus as set forth in claim 1 including means for setting the number of pulses per packet.

6. The apparatus as set forth in claim 3 including means for changing the pulse width of the pulses.

7. The apparatus as set forth in claim 5 including means for setting the number of pulses per packet.

8. The apparatus as set forth in claim 4 including means for setting the number of pulses per packet.

9. The apparatus as set forth in claim 3 including means for setting the number of pulses per packet.

10. The apparatus as set forth in claim 1 wherein the pulse width of each of the pulses is in the range of 1 to 3 milliseconds.

11. The apparatus as set forth in claim 1 wherein the number of pulses per packet is in the range of 2 to 5.

12. The apparatus as set forth in claim 3 wherein the number of packets of pulses per second is in the range of 3 to 25.

13. The apparatus as set forth in claim 1 wherein the pulses are direct current pulses.

14. A method for inducing electrotaxis and narcosis in fish during electrofishing with minimal injury to the fish, said method comprising the steps of:
   a) providing a source of electric power;
   b) generating an output of high power pulses from the source of electric power;
   c) developing a pulse train having a packet of the pulses repeated at a low frequency;
   d) modulating the power output generated during exercise of said step of generating:
   e) transmitting underwater the generated pulses.

15. The method as set forth in claim 14 wherein said step of generating includes the step of producing packets of pulses at a rate in the range of 3 to 25 packets of pulses per second.

16. The method as set forth in claim 14 wherein said step of generating generates 2 to 5 pulses per packet of pulses.

17. The method as set forth in claim 14 including the step of setting the width of the pulses.

18. The method as set forth in claim 17 wherein the pulse width set during said step of setting is in the range of 1 to 3 milliseconds.

19. The method as set forth in claim 19 wherein the pulses generated by exercise of said step of generating are direct current pulses.

\* \* \* \* \*